United States Patent [19]
Kyung

[11] Patent Number: 5,844,858
[45] Date of Patent: Dec. 1, 1998

[54] SEMICONDUCTOR MEMORY DEVICE AND READ AND WRITE METHODS THEREOF

[75] Inventor: Kyu-Hyun Kyung, Kyungki-do, Rep. of Korea

[73] Assignee: Samsung Electronics, Co., Ltd., Suwon, Rep. of Korea

[21] Appl. No.: 712,127

[22] Filed: Sep. 11, 1996

[30] Foreign Application Priority Data

Sep. 11, 1995 [KR] Rep. of Korea ................. 1995/29574

[51] Int. Cl.$^6$ ..................................... G11C 8/00
[52] U.S. Cl. ............. 365/233; 365/230.06; 365/230.01; 365/230.08
[58] Field of Search .............. 365/230.01, 233, 365/230.05, 230.06, 230.08

[56] References Cited

U.S. PATENT DOCUMENTS

| | | |
|---|---|---|
| 5,463,577 | 10/1995 | Oowaki et al. .................... 365/63 |
| 5,590,086 | 12/1996 | Park et al. ..................... 365/230.03 |
| 5,603,009 | 2/1997 | Konishi et al. ..................... 395/492 |

*Primary Examiner*—Viet Q. Nguyen
*Attorney, Agent, or Firm*—Marger, Johnson, McCollom, P.C.

[57] ABSTRACT

A semiconductor memory device includes input/output circuitry capable of operating in sync with an externally provided I/O clock signal. A data in buffer and a data out buffer provide for serial to parallel conversion of write data and, conversely, parallel to serial conversion of read data. The data buffers can be synchronized with the external I/O clock signal thereby decoupling their operation from the internal system clock signal. This strategy improves I/O bandwidth and further provides for matching different numbers of bit lines or word sizes as between the I/O data port and the memory array itself. An internal I/O clock generator can be provided for generating I/O clock signals, again without the limitation of synchronizing to the internal system clock signal.

17 Claims, 13 Drawing Sheets

SEMICONDUCTOR MEMORY DEVICE AND READ AND WRITE METHODS THEREOF

BACKGROUND OF THE INVENTION

1. Field of the Invention

The present-invention relates to a semiconductor memory device and, in particular, to a semiconductor memory device having improved bandwidth input and output using an external synchronous signal and read/write methods thereof.

The present application for a semiconductor memory device for exchanging data by using a synchronous signal and read/write methods thereof, is based on Korean Application No. 29574/1995 which is incorporated herein by reference for all purposes.

2. Description of the Related Art

Recently, while the operating frequency of microprocessors continues to increase in computer systems, the operating frequency of a semiconductor memory device has increased relatively slowly. This results in a memory bottleneck that hampers performance of the computer. One solution for relieving the memory bottleneck is to increase the width of the memory bus so that the amount of the data or word size between the computer and semiconductor memory device is increased. However, at the same time, increasing the capacity of the unit memory results in reducing the granularity as a minimum memory unit.

For example, in the case of a memory system in which the actual wiring width of the memory bus is 64 bits, with using a 4 mega bit memory of which the data wiring width is 8, the memory is incremented by a 32 mega bit unit. But, when using a 256 mega bit memory where the bus width is 8, increasing the bus width to 64 provides a memory increment of 2048 mega bit. For this reason, apart from enlarging the capacity of the unit memory, it is also known to increase the data wiring width of the unit memory in order to resolve the problem of the granularity without sacrificing performance of the system. Thus, as can be seen in the above example, the granularity as the minimum memory unit without deterioration on the performance thereof can be formed by increasing the data wiring width of the unit memory to 64. However, such a method gives rise to the following problems: First, an increment of the chip size follows from the increase in the number of pads in a circuit. Second, an increment in power consumption follows as well due to the increase of the circuit size, the increased number of the conductors, and the increase in the number of output terminals, each of which should includes a driver having a large load, and so on. Accordingly, it is not desirable to use the above method to improve the I/O bottleneck in a semiconductor memory.

An alternative approach is to increase the operating frequency of the memory. In other words, as noted beforehand, by increasing the operating frequency of the 256 mega bit memory in which the data wiring width is 8, the granularity remains equal to one unit (word) of the memory with no deterioration in performance. Moreover, when using a fast memory as described above, the performance of the memory system can easily be augmented by arranging a plurality of smaller word size (unit) memories in parallel. A synchronous memory is exemplary of increasing the operating frequency of the unit memory. In a memory system constructed with synchronous memory, control signals and data signals for operating the memory, such as an address signal, a chip select signal, a write enable signal etc., are synchronized with a global clock for controlling the overall memory system including a memory and a memory controller.

Using the synchronous memory, all of the control signals operate in synchronism with the global clock. Consequently, although data having N times the size of the memory port word size can accessed in the memory during one clock period, it is impossible to exchange the data at a speed greater than the frequency of the global clock. By data "exchange" we mean a read or a write operation through a memory port or terminal. In addition, increasing the frequency of the global clock to improve the bandwidth of the data exchange also increases the operating frequency of the overall memory circuit, thereby incrementing the operating power of the memory. Further, there is a problem in that the maximum operating frequency of the global clock is limited by the phase difference of the clock generated between each clock wiring of the memory and controller at a specific time.

Figure 1:
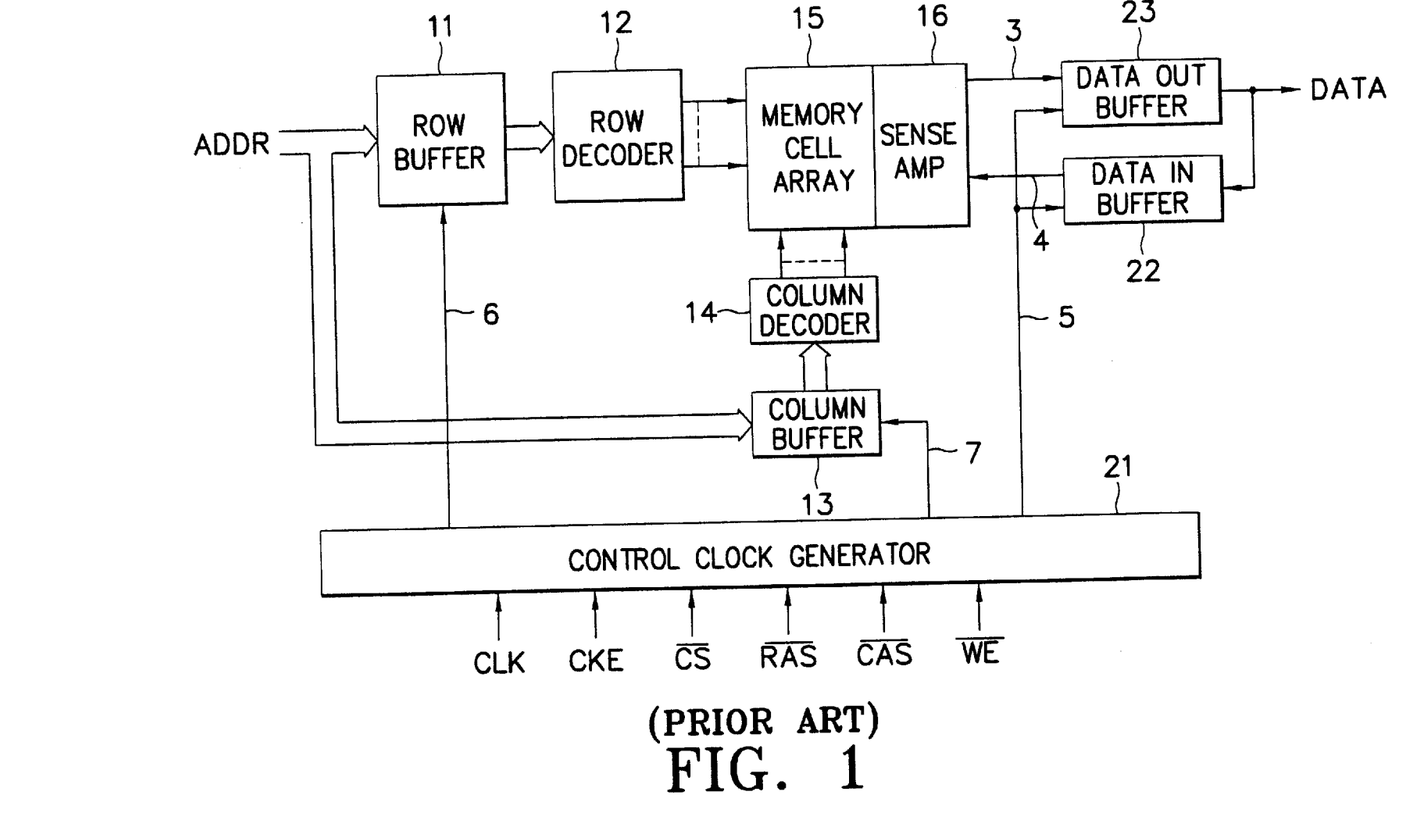
FIG. 1 a block diagram illustrating the construction of a prior art memory.

FIG. 1 is a block diagram illustrating the construction of a prior art semiconductor memory device. With reference to FIG. 1, a system clock signal CLK and a clock enable signal CKE are transmitted to a control clock generator 21, the above signals CLK and CKE being supplied from outside the semiconductor memory device. Also, a chip select signal CS/, a write enable signal WE/, a row address strobe signal RAS/, and a column address strobe signal CAS/ are input to the control clock generator 21 (the virgule "/" being used herein to designate an active low signal, as indicated by a horizontal bar over the corresponding signal name in the drawing). A write data signal DATA is delivered from the exterior to a data-in buffer 22 in synchronism with the system clock CLK. A read data signal DATA is delivered from a data-out buffer 23 to the exterior. The DATA terminal or port of course may be multiple bits wide.

The control clock generator 21 generates internal control signals, some of which are synchronized to the system clock CLK, in response to the various external control signals as long as the clock enable signal CKE is asserted. A control signal 6 generated from the row address strobe signal RAS/ is transmitted to a set input terminal of a row (address) buffer 11, thereby latching a row address from an address signal ADDR. ADDR is a multiple-bit address input to an address terminal or port. Similarly, a control signal 7 generated from the column address strobe signal CAS/ is transmitted to a set input terminal of a column buffer 13, for latching the address signal ADDR therein. An output signal of the row buffer 11 is transmitted to an input terminal of a row decoder 12. The row decoder selects or drives a corresponding word line of a memory cell array 15, all of which is conventional. An output signal of the column buffer 13 is transmitted to an input terminal of the column decoder 14 and thus, drives a column selection line of the memory cell array 15.

Figure 2A:
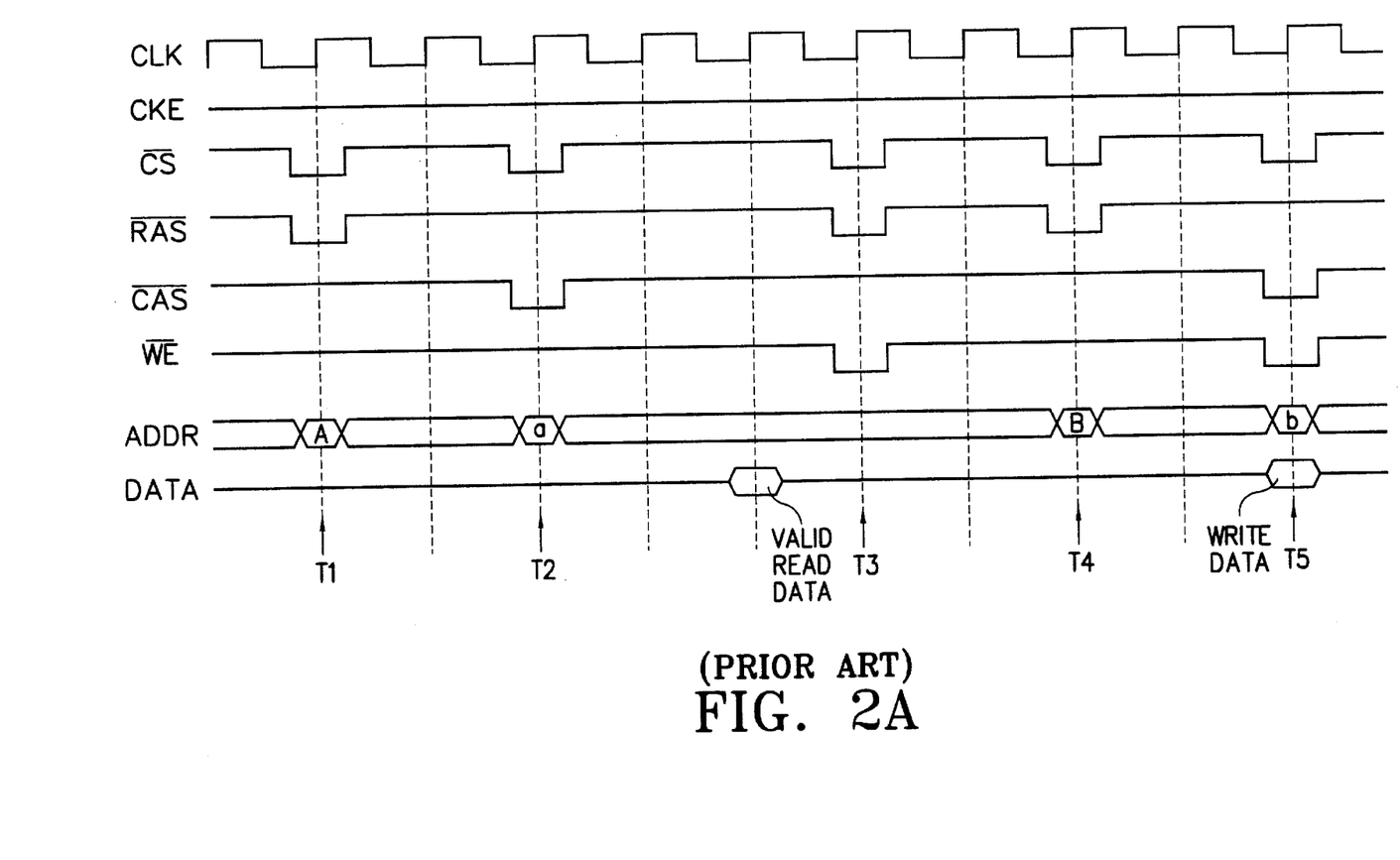
FIGS. 2A and 2B are timing diagrams illustrating operation of the prior art memory.
Figure 2B:
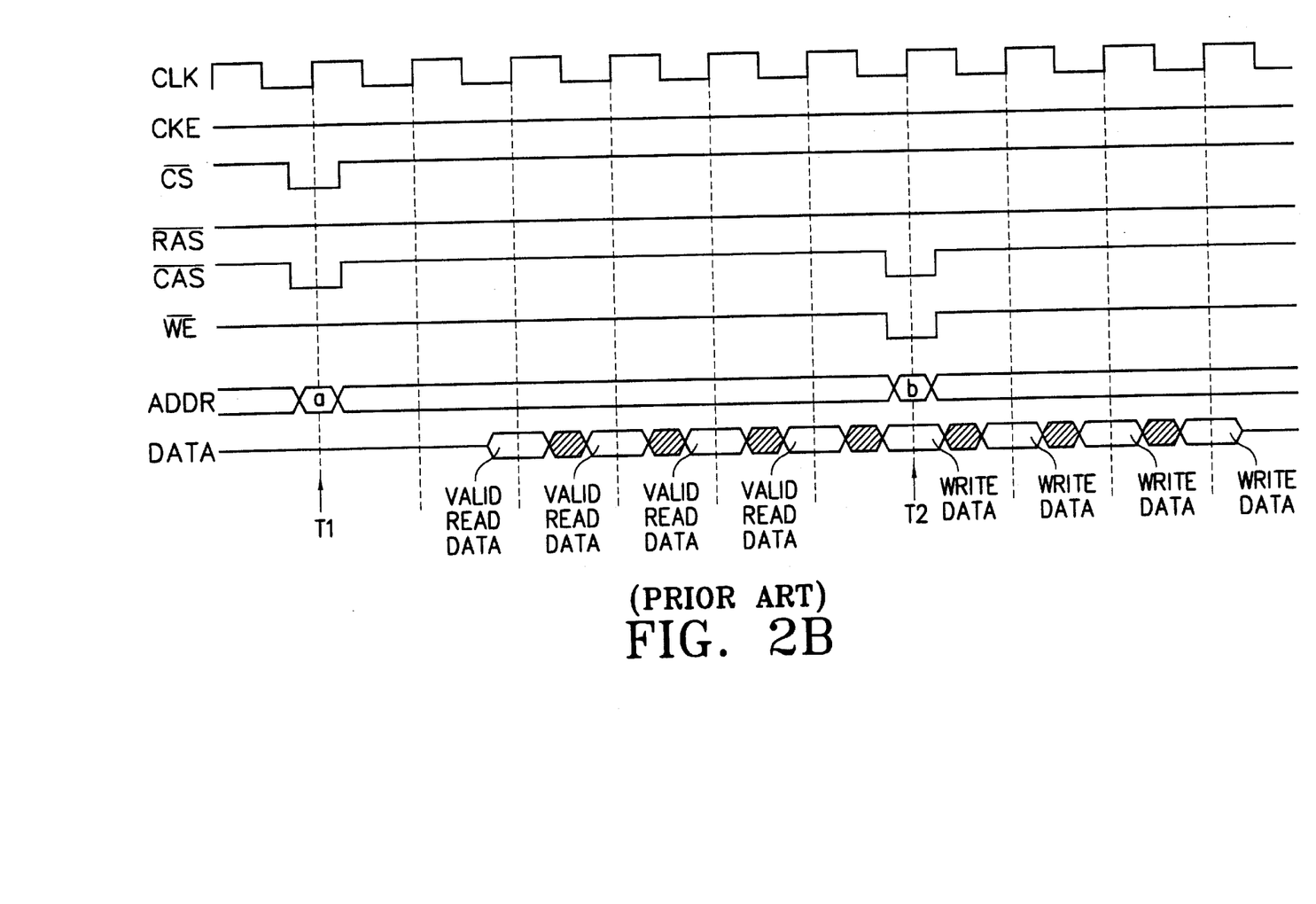

In a write operation, externally applied DATA is latched in the data-in buffer 22 (also referred to as a data input buffer, or simply "input buffer"), as further explained later, and the contents of the data-in buffer 22 is written into the memory cell array 15 through sense amplifiers 16. Conversely, in a read operation, data from the memory cell is amplified by the sense amplifier 16 and latched in the data-out buffer (or "output buffer") 23. The data received from the exterior (i.e. write data) or the data transferred to the exterior (read data) is synchronized with the system clock CLK, by control signals 5 provided by the control clock generator circuit 21. Operation of the memory device of FIG. 1 is further illustrated in the timing diagrams of FIGS. 2A and 2B. Specifically, FIG. 2A shows a read cycle and a write cycle and FIG. 2B shows the read and write operations in a page mode cycle.

The memory as described above can increase the margin of the setup and the hold time for latching the signal, by operating all of inputs/outputs such as the control signals, the address signal, and the data in synchronism with the system clock CLK, and increasing the system clock operating frequency. However, in case of using the memory of FIG. 1, now that all of signals operate in synchronism with the system clock CLK, even if data having N times the memory internal word size can be accessed during a period of one system clock, it is impossible to exchange the data at a speed greater than the frequency of the system clock CLK. In other words, the I/O bandwidth is limited by the system clock frequency in the synchronized system. In addition, increasing the frequency of the system clock CLK to improve the I/O bandwidth increases the operating frequency of the overall memory circuit, thereby increasing the operating power of the memory. Further, there is a problem in that the maximum operating frequency of the system clock CLK can be limited by the phase difference across the various clock wirings of the memory and controller at a specific time. Accordingly, simply increasing the system clock frequency is not a promising solution to improving I/O bandwidth.

SUMMARY OF THE INVENTION

It is therefore an object of the present invention to provide a semiconductor memory device for operating communication of a control signal in synchronism with a global clock supplied commonly to a memory and a memory controller, while exchanging data by a source synchronous signal method so that the data exchange is synchronized to the data source rather than the global clock.

Another object of the invention is to improve I/O speed of a semiconductor memory device without increasing the system clock frequency.

The above object can be achieved according to the present invention with a semiconductor memory device which includes a plurality of bit lines, a plurality of word lines crossed with the plurality of bit lines, and a memory cell array including a plurality of memory cells positioned at cross points where the bit lines are crossed with the word lines, comprising: an address port for receiving inputs of a row address supplied while a row address enable signal is in a first state and a column address enable signal is in a second state, and a column address supplied while the column address enable signal is in the first state and the row address enable signal is in the second state; a row decoder for receiving the input of the row address from the address port and enabling a word line corresponding to the received row address; a plurality of sense amplifiers for amplifying signals of the bit lines enabled by the memory cell connected to the enabled word line; a column decoder for receiving the column address from the address port and coupling a selected bit line with a common data line; and a source synchronous communicator for interfacing the data common line with the exterior and performing the input/output of the data of the exterior with the memory cell array.

Another aspect of the invention includes read/write methods of operation of a semiconductor memory device of the type that includes a plurality of bit lines, a plurality of word lines crossed with the plurality of bit lines, and a memory cell array including a plurality of memory cells which supplies the data stored in the bit line coupled in correspondence with the enable word line while being positioned at cross points where the bit lines are crossed with the word line, a plurality of sense amplifiers for amplifying signals of the bit line enabled by the memory cell connected the enabled word line, terminals for data having the predetermined number, a terminal for a source generation synchronous signal, data lines having the number increased by the predetermined number, and a data-in buffer and a data-out buffer, the buffers performing communication of the data with the exterior. Such methods includes the steps of: (a) supplying a write enable signal of a second state, a column address enable signal of the second state, a row address enable signal of a first state, and a chip select signal of the first state from the memory cell array; (b) latching a row address supplied while the row address enable signal is in the first state and the column address enable signal is in the second state, to a row buffer at a single edge of an external clock signal; (c) after latching the row address, supplying the column address enable signal of the first state, the row address enable signal of the second state, and the chip select signal of the first state; (d) latching a column address supplied while the column address enable signal is in the first state and the row address enable signal is in the second state, to a column buffer at the single edge of the external clock signal; and (e) outputting the plurality of data transmitted to the data-out buffer included in the terminals for each data from memory cells corresponding to the row address and the column address, to the source synchronism communicator during time equal to one period of the external clock, thereby reading the data.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, wherein.

DETAILED DESCRIPTION OF THE PREFERRED EMBODIMENT

Hereinafter, a preferred embodiment of the present invention will be described in detail with reference to the accompanying drawings. Throughout the drawings, it is noted that the same reference numerals will be used to designate like or equivalent elements having the same function. Further, in the following description, numerous specific details are set forth to provide a more through understanding of the present invention. It will be apparent, however, to one skilled in the art that the present invention may be practiced without these specific details.

Figure 3:
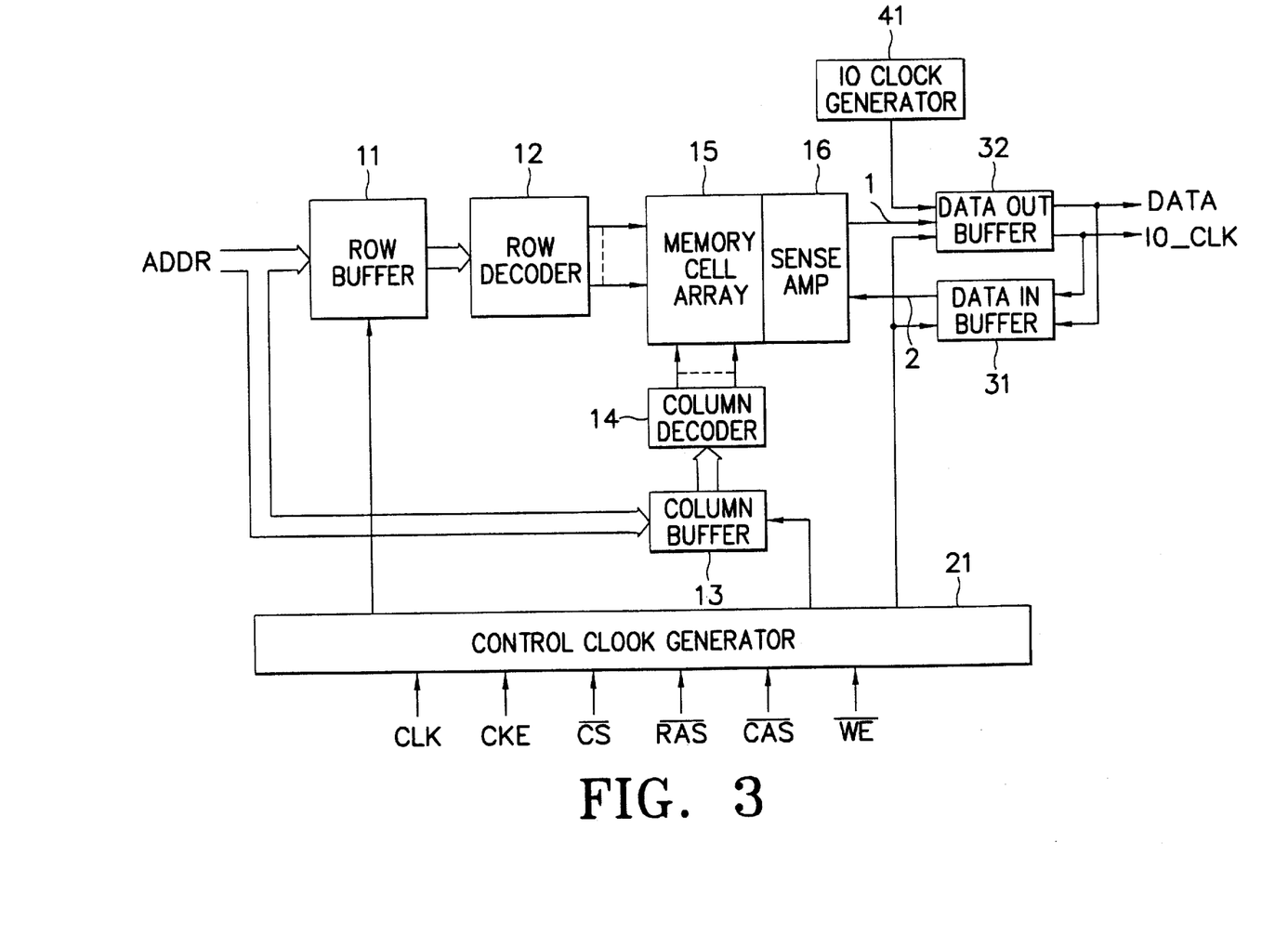
FIG. 3 is a block diagram illustrating the construction of a semiconductor memory according to the present invention.

FIG. 3 is a block diagram illustrating the construction of a semiconductor memory device according to the present invention. The detailed description of those elements of FIG. 3 which perform the same functions as the corresponding elements of FIG. 1 will not be repeated.

The most significant difference between the memory of FIG. 1 and the memory of FIG. 3 lies on the construction of a data-in buffer 31 and a data-out buffer 32. Firstly, in the data-in buffer 31, a synchronous signal I/O_CLK is received together with the input DATA from the exterior, and the data from the exterior is latched in the data-in buffer 31 in synchronism not with the internal system clock signal CLK but with the synchronous signal I/O_CLK. We call this a "source synchronous" arrangement because the data is synchronized to the source—here an external data source and clock I/O_CLK.

For a read operation, data latched in the data-out buffer 32 is output to the exterior in synchronism with an internal clock signal generated not from the system clock CLK but from a separate I/O (input/output) clock generator 41. Thus, these two data buffers 31 and 32 operate according to the source synchronous signal method.

Thus, it is unnecessary to match the operating frequency of the system clock CLK with the operating frequency of the I/O data exchange. For example, suppose the internal data bus line 1 from the sense amplifier 16 to the data-out buffer 32 has, say 16 bits. One word is latched in the data-out buffer in one column cycle. Now the internal bus data line 2, between the sense amplifier 16 and the data-in buffer 31, can be increased to say N times that number of bit lines, thereby making it possible to exchange the data with the outside world at a speed greater than the frequency of the system clock CLK by way of increasing the frequency of the source synchronous signal I/O_CLK.

Figure 4A:
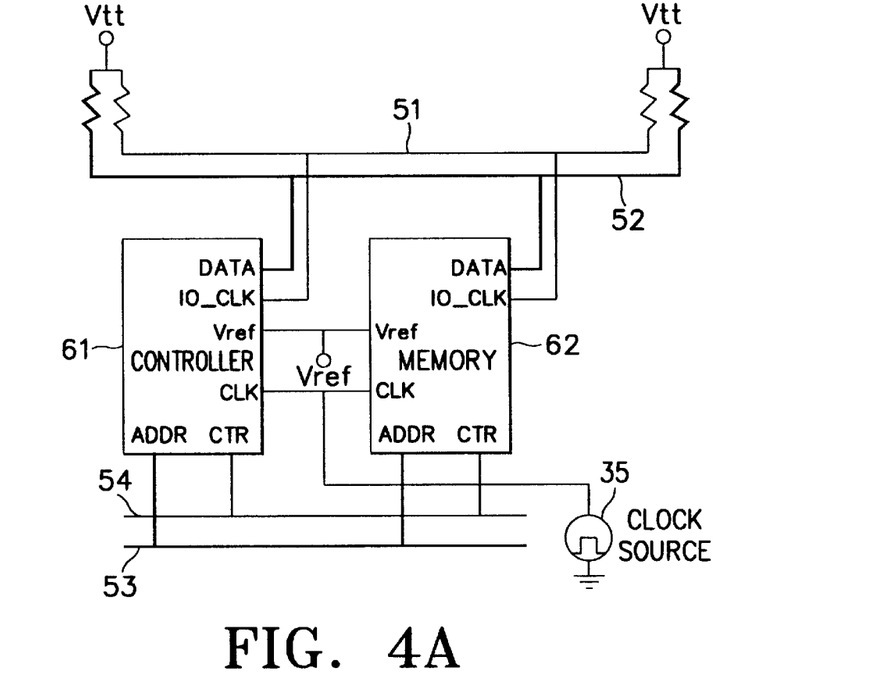
FIG. 4A is a block diagram illustrating the construction of a memory system using a memory constructed according to the principles of the present invention and illustrating the I/O clock signal.
Figure 4B:
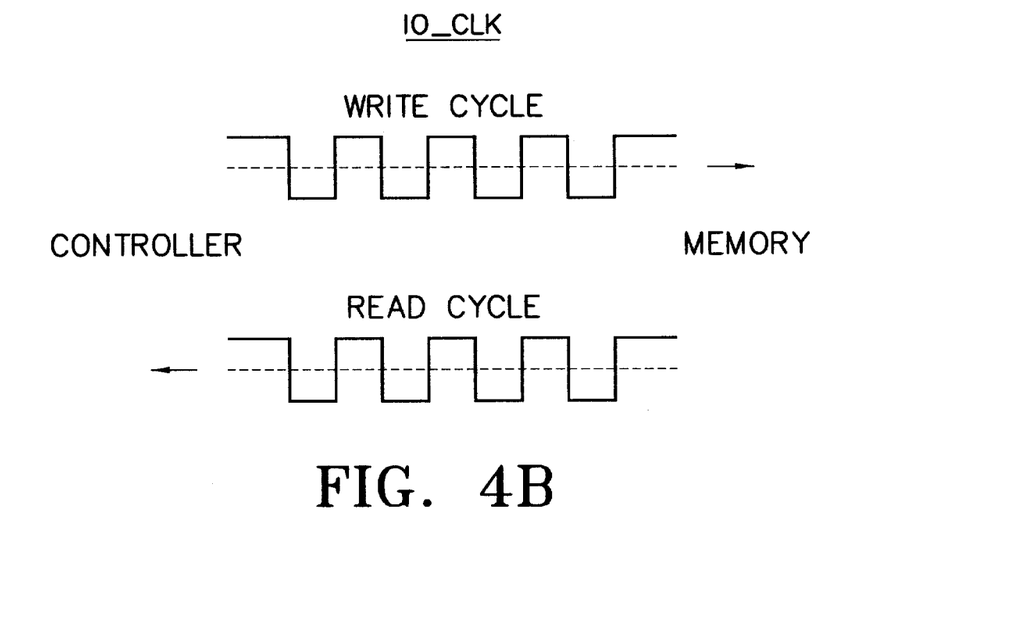
FIG. 4B is a timing diagram illustrating the operation of FIG. 4A.

FIG. 4 is a block diagram illustrating the construction of a memory system using a memory constructed according to the principles of the present invention. A clock source 35 transmits the system clock signal CLK to the controller 61 and to the memory 62. The address signal ADDR and various control signals CTR from the controller 61 are transmitted via buses 53 and 54, respectively, to the memory 62. Meanwhile, now that the data exchange frequency according to the present invention can be performed at N times the system clock CLK frequency, transmission lines 51 and 52 are provided to carry the synchronous signal I/O_CLK and the data word DATA, respectively, at high frequency. Each transmission line 51,52 includes a resistance element pulled up to a supply voltage Vtt for impedance matching at both terminals thereof. Additionally, it can be expected that the data and the synchronous signal I/O_CLK may have relatively limited voltage swings typical of data communication at high frequency. A reference voltage Vref for sensing the state of the small swing input is added for that reason. In the arrangement shown, the synchronous signal I/O_CLK is delivered from the controller 62 to the memory 62 upon the write cycle, and is delivered from the memory 62 to the controller 61 upon the read cycle, as illustrated in the lower part of FIG. 4.

Figure 5A:
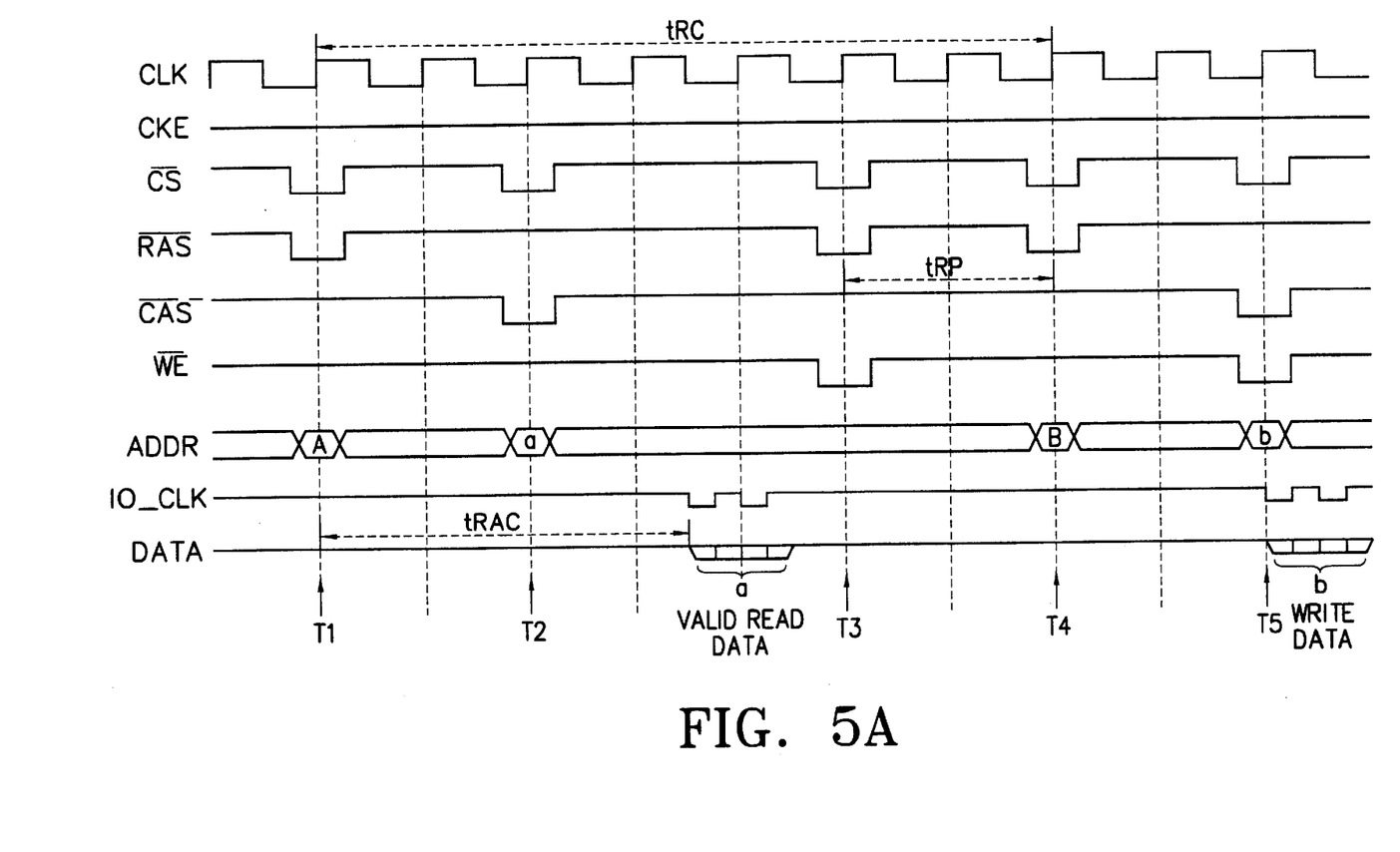
FIG. 5A and 5B are timing diagrams illustrating operation of the semiconductor memory device according to the present invention, the latter showing a page mode of operation.
Figure 5B:
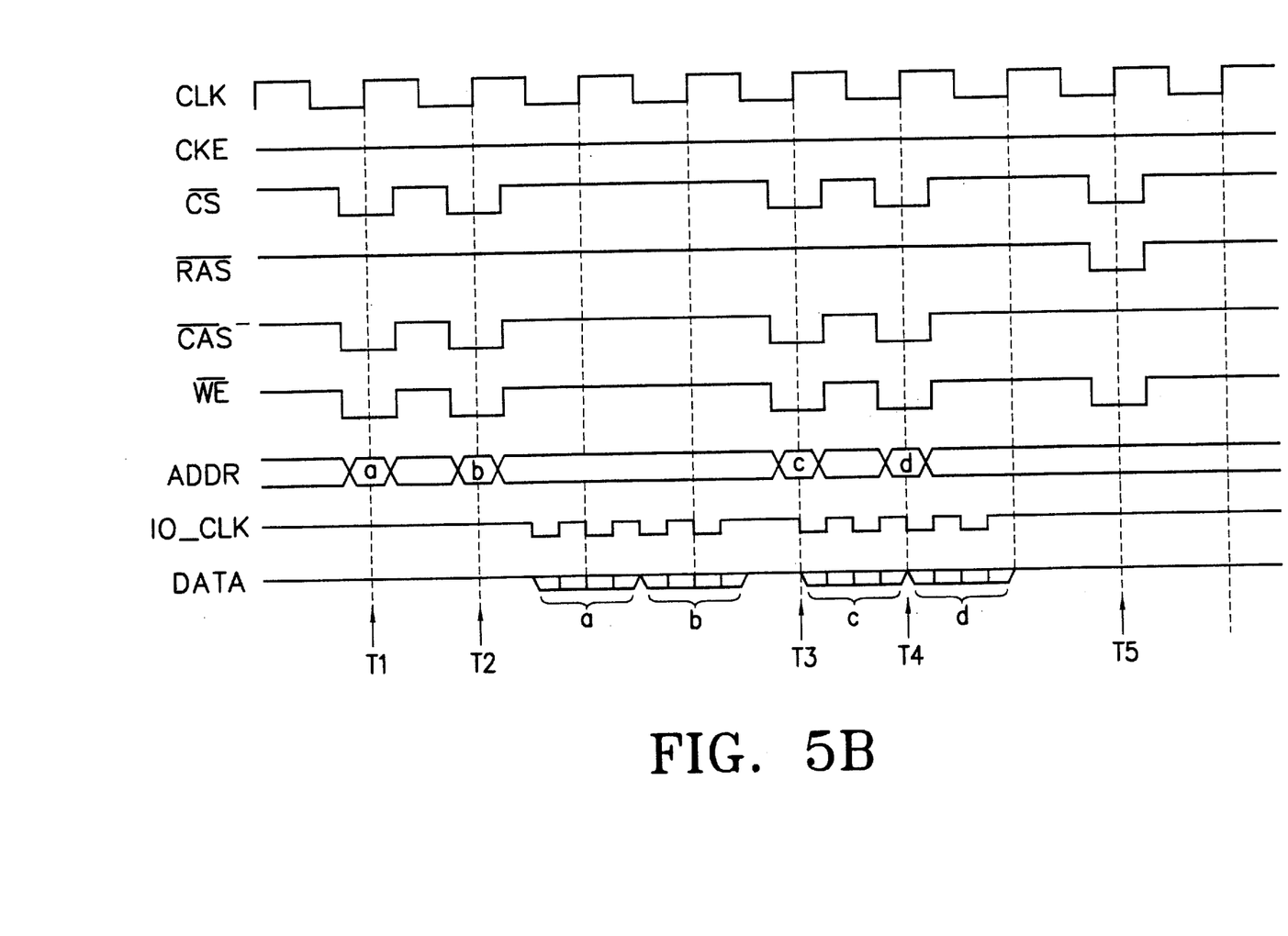

FIGS. 5A and 5B are timing diagrams illustrating the memory system operation according to the present invention, wherein FIG. 5A shows the read and write cycles and FIG. 5B shows the read and write operations in the page mode cycle. In this illustration it is assumed that N=4 and the data is transmitted at both edges of the synchronous signal I/O_CLK, so that the bandwidth of the data exchange is multiplied.

Figure 6A:
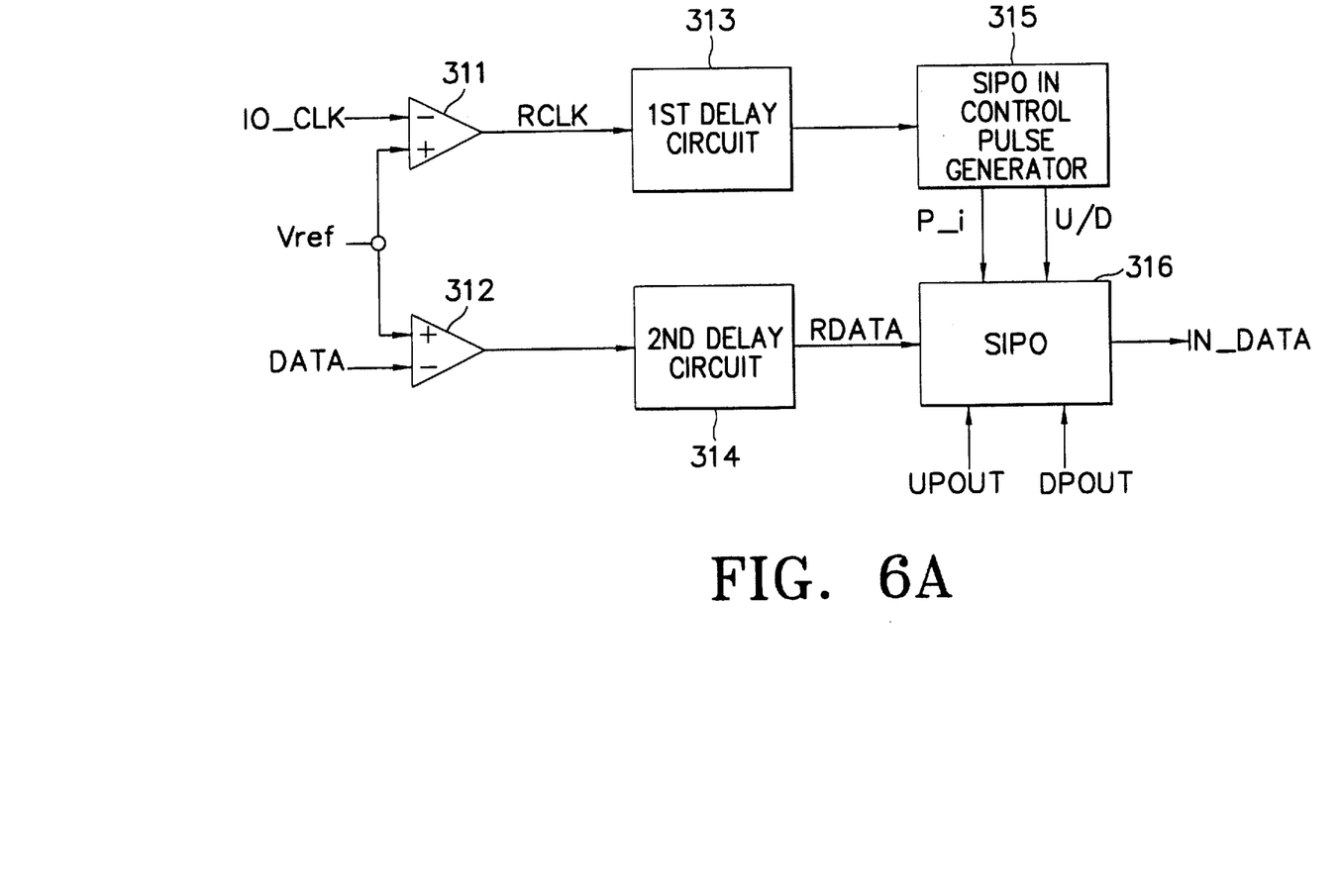
FIG. 6A is a circuit diagram illustrating one embodiment of the data-in buffer of FIG. 3 in greater detail.
Figure 6B:
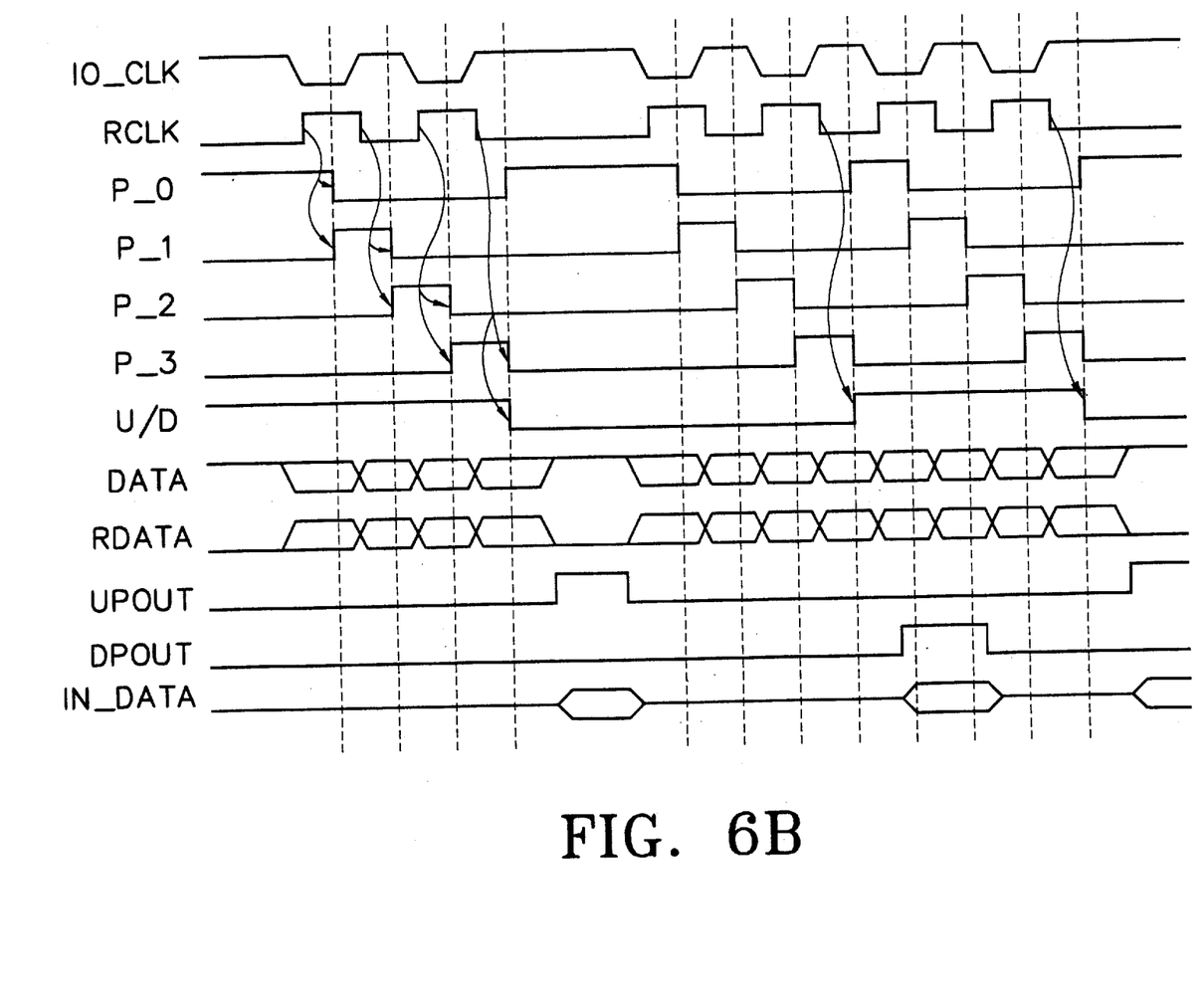
FIG. 6B is a timing diagram illustrating operation of the data-in buffer as shown in FIG. 6A.

FIG. 6A is a circuit diagram illustrating a data-in buffer as an embodiment according to the present invention, and FIG. 6B is a timing diagram illustrating operation of the data-in buffer as shown in FIG. 6A. Again we assume that N=4 and the external interface environment is the same as that of FIG. 4. As shown in FIG. 6A, a comparison amplifier 311 compares and amplifies the synchronous signal I/O_CLK with the reference voltage Vref, thereby generating a signal RCLK. RCLK is input to a first delay circuit 313, and thence to a SIPO in (serial in parallel out) control pulse generator 315. SIPO control pulse generator receives the delayed signal RCLK and generates an U/D (up/down) signal and a series of pulse signals P_i (i=0,1,2,3) based on the dual edges of the signal RCLK. (The number of pulse signals =N.) See FIG. 6B—showing the relationships among these control signals. The U/D signal toggles after each series of four edges of the RCLK signal. SIPO control pulse generator 315 provides the generated U/D signal and the P_i signals to a register SIPO 316. A second comparator 312 receives the DATA stream and compares and amplifies the DATA signals and generates a delayed signal RDATA through a second delay circuit 314. The delayed signal RDATA in turn is connected to the serial input terminal of SIPO 316. SIPO 316 forms parallel words of input data IN_DATA for writing to the memory array as further explained below.

Figure 7:
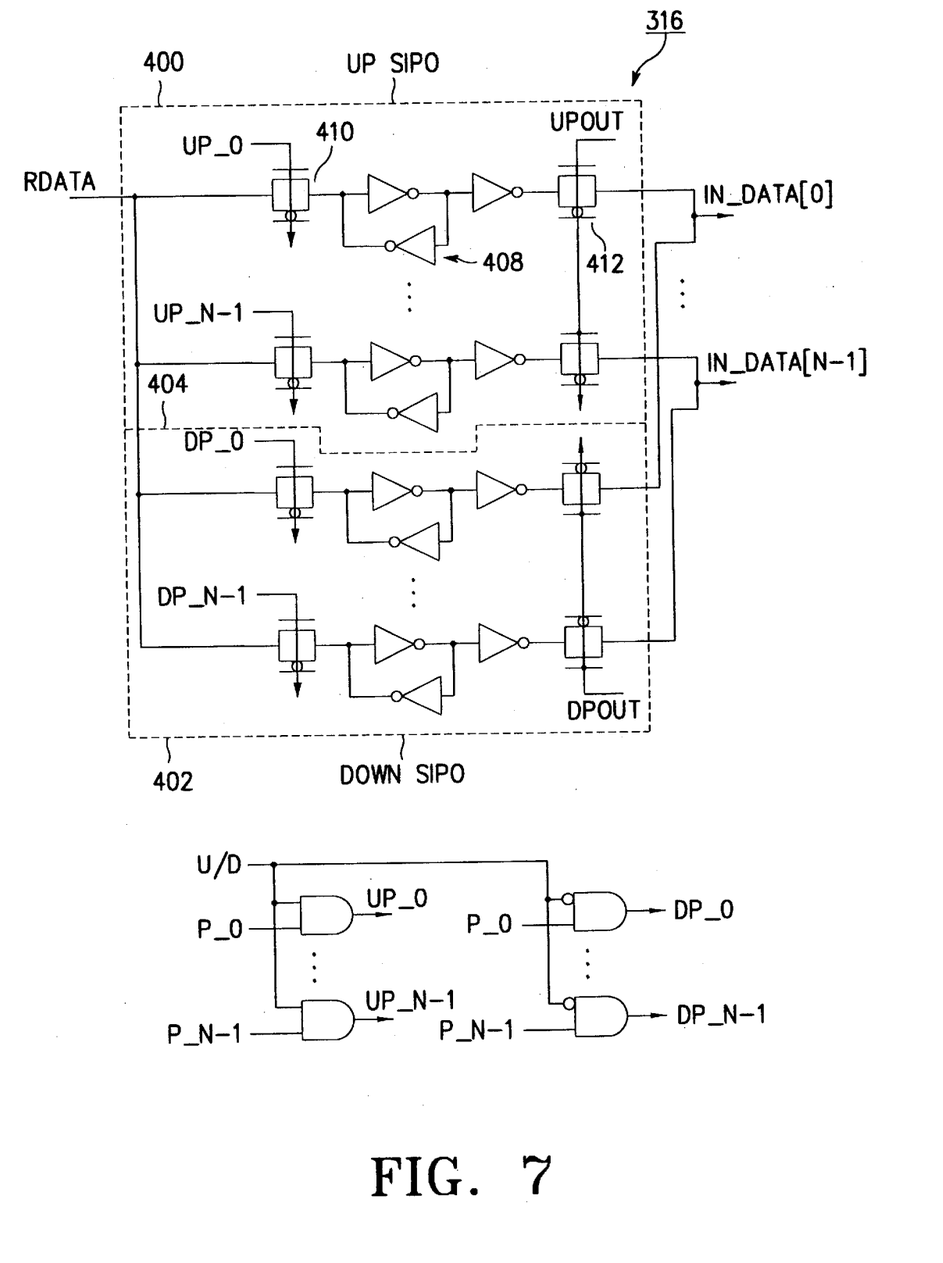
FIG. 7 is a circuit diagram illustrating one example of a serial in parallel out (SIPO) circuit as an embodiment according to the present invention.

FIG. 7 is circuit diagram illustrating a serial in parallel out (SIPO) circuit according to the present invention. Referring to FIG. 7, the SIPO 316 is comprised of an UP SIPO 400 and a DOWN SIPO 402, separated by dashed line 404. Each SIPO includes a series of N memory elements. For example, the first memory element 408 of UP SIPO 400 receives the input signal RDATA through an input transfer gate 410 under control of the UP_0 control signal. All inputs of the UP and DOWN SIPOs are commonly connected to the signal RDATA. The sequences of control signals UP_i (i=0,1,2,3) or DP_i (i=0,1,2,3) are generated by signals P_i (i=0,1,2,3) and by the U/D signal from the SIPO control pulse generator 315 in one read cycle, so as to operate the input transfer gates of the UP or DOWN SIPOs alternately. Thus the first four bits of RDATA are stored sequentially in the UP SIPO memory elements, and then the second four bits are stored in the DOWN SIPO 402. The control logic is shown in the lower part of FIG. 7, where it can be seen that each of the input transfer gate control signals UP_0 to UP_N−1 are qualified by the pulse signals P_0 to P_N−1 and the U/D signal high. Conversely, each of the DOWN SIPO input transfer gate control signals DP_0 to DP_N−1 are qualified by the pulse signals P_0 to P_N−1 and the U/D signal low.

The outputs of the two SIPOs are coupled with each other as a pair as depicted in FIG. 7, each bit being coupled through a corresponding output transfer gate such as transfer gate 412. Thus N signals IN_DATA[0] to IN_DATA[N−1] are generated in parallel from one of two UP and DOWN SIPOs by a control signal UPOUT or DPOUT generated in the control clock generator 21 of FIG. 3, thereby transmitting the generated signals IN_DATA to the sense amplifier 16 of FIG. 3. FIG. 6B shows the operating timing diagram of the above data-in buffer. MARKER One reason to use two (UP and DOWN) SIPOs as above is that the two SIPOs can operate to interleave with each other in the page mode write cycle, so that the margin of the time window of the signals IN_DATA, i.e., the pulse widths of the signals UPOUT/DPOUT and the time taken to generation of the signals UPOUT/DPOUT from the signal RDATA can be sufficiently ensured. The first and second delay circuits 313 and 314 as shown in FIG. 6A are installed to optimally ensure the setup and hold time margin when adjusting the timely position of the rising edge and the falling edge of the signals P_i and storing the signal RDATA at each memory element of the SIPOs.

Figure 8A:
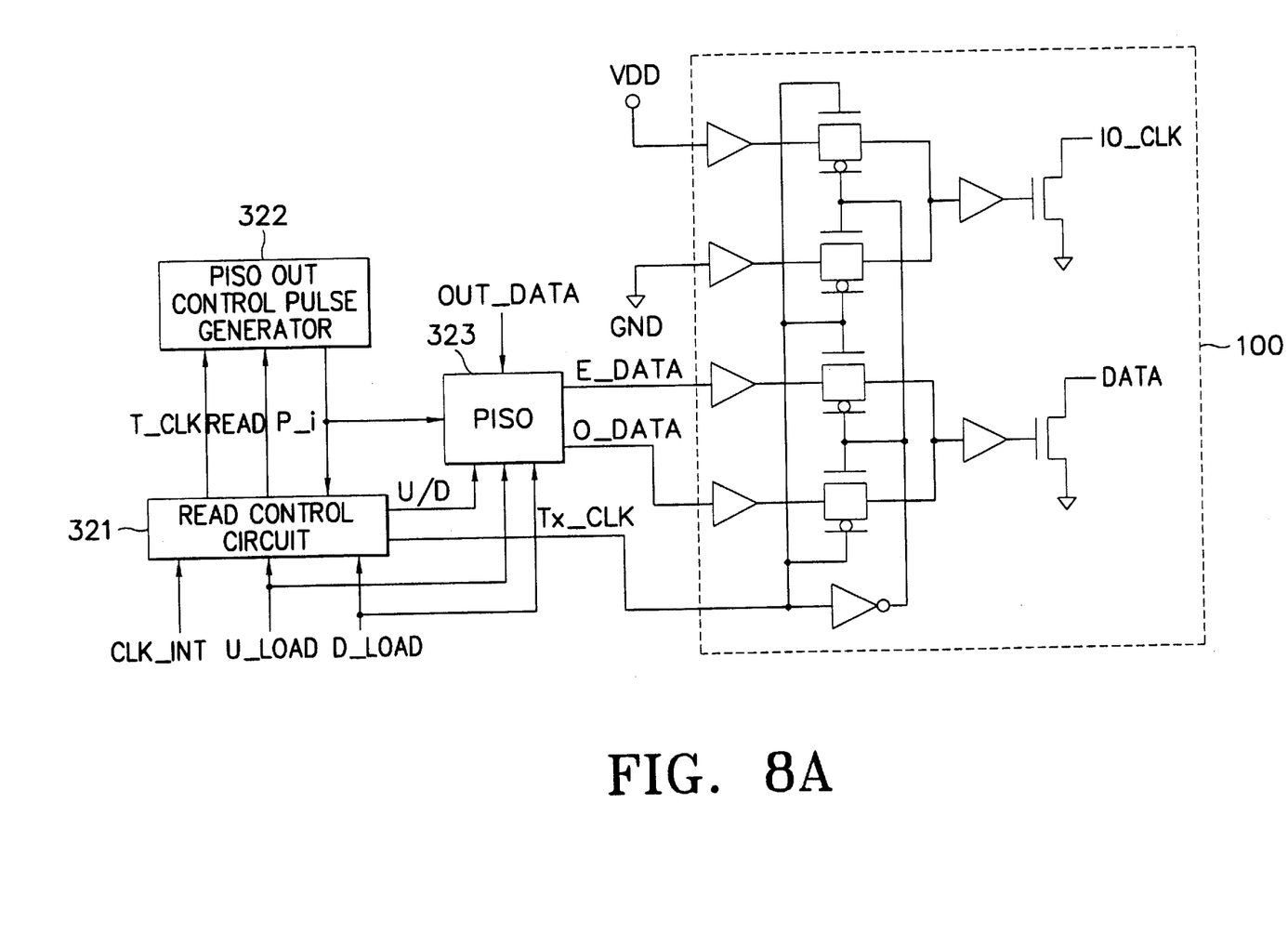
FIG. 8A is a circuit diagram illustrating the data-out buffer of FIG. 3 in greater detail.
Figure 8B:
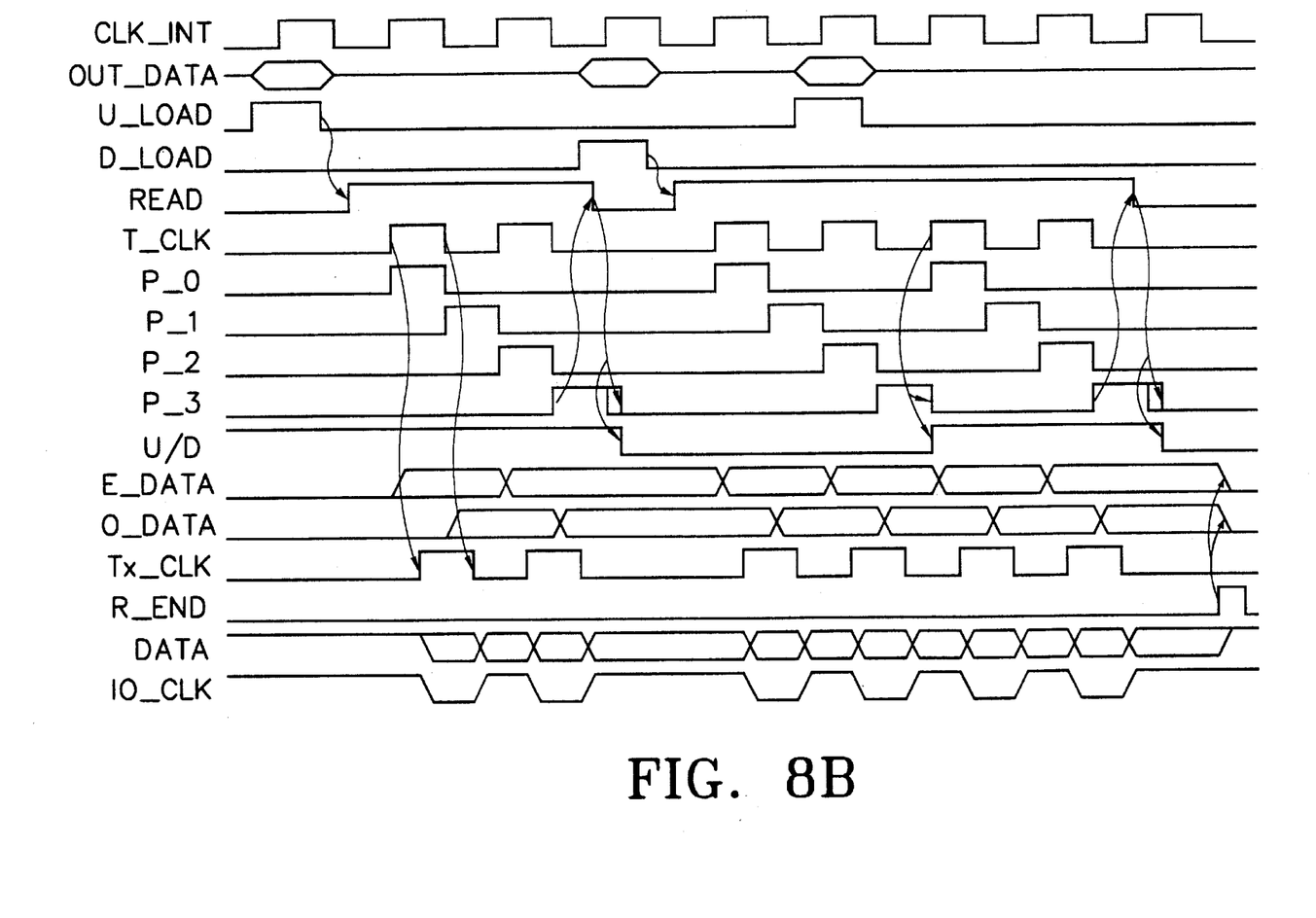
FIG. 8B is a timing diagram illustrating operation of the data-out buffer as shown in FIG. 8A.

FIG. 8A is a circuit diagram illustrating the data-out buffer of FIG. 3 in greater detail. Again it is assumed for purposes of illustration that N=4 and the external interface environment is same as that of FIG. 4. As illustrated in FIG. 8A, a read control circuit 321 receives the falling edge of the signal CLK_INT from the I/O clock generator 41 of FIG. 3, which is initially generated after the falling edge of the down load D_LOAD signal or the up load U_LOAD provided by the control clock generator 21 of FIG. 3. The read control circuit generates the READ signal, and transmits it to the PISO (parallel in serial out) output control pulse generator 322. Further, while the READ signal is asserted, the signal CLK_INT is transmitted as the signal T_CLK to the PISO output control pulse generator 322 for generating the P_i timing pulses. Responsive to the above signals, the PISO output control pulse generator 322 generates control signals P_i (i=0,1,2,3) as shown in FIG. 8B on both edges of the signal T_CLK, and provides signals P_i to the PISO 323. The read control circuit also provides TX_CLK for clocking the read data out as explained below.

The read control circuit 321 disables the READ signal after delay during a predetermined time from the rising edge, unless a new signal U_LOAD or D_LOAD is asserted during the period between pulses P_0 and P_2. If neither such signal is so asserted, the control circuit transmits the state of the U/D signals. In that case, the PISO out control pulse generator 322 disables a signal P_3 on the falling edge of the read signal. Conversely, if a new signal U_LOAD or D_LOAD is generated during the period between pulses P_0 and P_2, the read control circuit 321 does not disable the read signal, and the read cycle continues. Then, it toggles the U/D signal and disables the signal P_3 at the next rising edge of the signal T_CLK, as shown in FIG. 8B during the second READ pulse. Thus, in one read cycle, N signals of OUT_DATA from the sense amplifier 16 of FIG. 3 are synchronized with the signal U_LOAD or D_LOAD (provided by the clock generator circuit 21 of FIG. 3), and loaded into the PISO 323.

Figure 9:
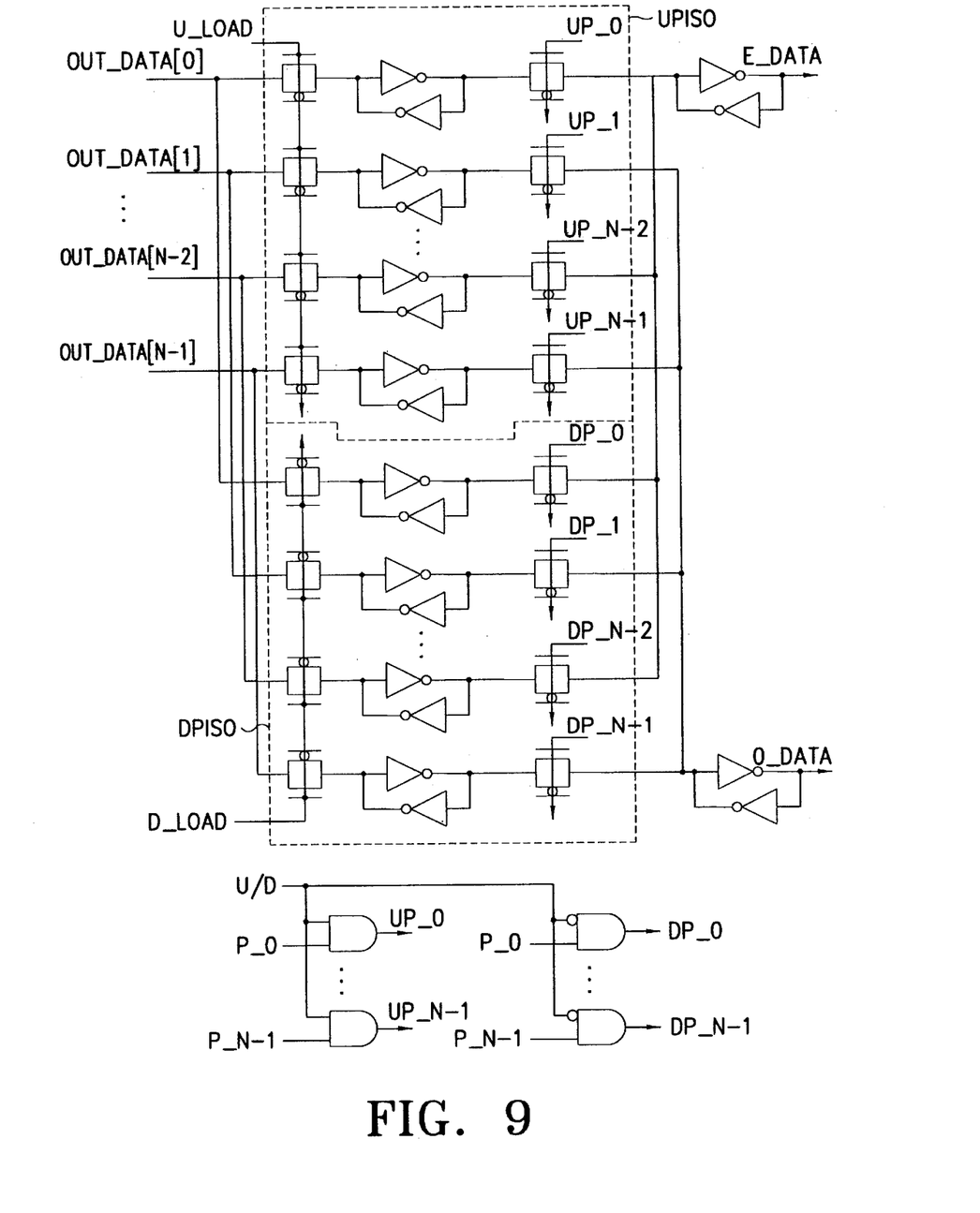
FIG. 9 is a circuit diagram illustrating one example of a parallel in serial out (PISO) circuit according to the present invention.

FIG. 9 is a circuit diagram illustrating a parallel in serial out (PISO) circuit according to a presently preferred embodiment. With regard to FIG. 9, the PISO preferably is partitioned into two PISO subcircuits (UPISO and DPISO) which are each composed of N memory elements. (Four memory elements are shown explicitly for illustration.) Corresponding input terminals of the UPISO and DPISO are connected together as shown in FIG. 9, and each input signal OUT_DATA[0] to OUT_DATA[N−1] is connected to a respective one of the common input terminals. Recall the OUT_DATA is that provided from the memory array sense amps during a read operation.

Control signal U_LOAD transfers OUT_DATA into the UPISO through the transfer gates as shown. Control signal D_LOAD transfers OUT_DATA into the DPISO through the corresponding transfer gates; only one of these two signals operating at any one time. On the output side of the memory elements, transfer gates are provided for transferring the stored data in turn to output terminals E_DATA (even data) and O-DATA (odd data), alternate stored data bits being provided accordingly. The output transfer gates are controlled by the signals UP_i (i=0,1 . . . N−1) and DP_i (i=0,1 . . . N−1), generated as shown in the lower part of FIG. 9 in response to the U/D control signal and the pulse signals P_0 to P_N−1 of FIG. 8A and 8B. In operation, the even data E_DATA and the odd data O_DATA are generated as shown in FIG. 8A and transmitted to the data out circuit 100 of FIG. 8A.

Referring again to FIG. 8A, the delayed signal TX_CLK of the signal T_CLK is transmitted from the read control circuit 321 to the data out circuit 100. The TX_CLK signal clocks the even and odd data, alternately, to the DATA output port as illustrated. Furthermore, the data out circuit 100 outputs the synchronous signal I/O_CLK synchronized with the data DATA by using a power supply voltage VDD and a ground voltage GND. FIG. 8B is a circuit diagram illustrating the data-in buffer as another embodiment according to the present invention.

In the preferred embodiment, the reason to use two PISOs as described above is to operate the PISOs in an interleaved fashion in the page mode write cycle and to form the sequential output data stream. Meanwhile, the even data E_DATA and the odd data O_DATA are available on the rising and the falling edges of the clock signal TX_CLK, respectively, thereby ensuring adequate setup and hold time margin so that correct data is transmitted out of the device.

At the same time, as depicted in FIG. 3, the I/O clock generator 41 for generating the signal CLK_INT and determining the bandwidth of the data output in the read cycle can be implemented in various ways. First, it can be configured to multiply the frequency of the system clock CLK, thereby increasing bandwidth. Secondly, it can be arranged to receive a fast I/O clock signal from the exterior and convert the received clock signal into the interval clock. Moreover, it can take the form of ring oscillator capable of adjusting the frequency. Any one or more of these options can be used depending on the intended applications.

In general, one object of the present invention is to separate the communication methods of the control signals and the data signal, thereby overcoming the disadvantages and limitations of the prior art of FIG. 1. That is, while the communication of control signals is performed in synchronism with the global clock supplied commonly to the memory and the memory controller as in the prior art synchronous memory, the communication of the data signal is performed to transmit the source synchronous clock of the data together with the data signal in a transmitter for transmitting the data between the memory or the controller. Also, by utilizing the source synchronous method described herein, in which the data are received in synchronism with the source synchronous clock signal, memory access operations can be conducted without synchronizing the source to the memory.

In this manner, when the communication between the memory and the memory system is performed, the memory is constructed to access the data having the number of N times as much as the number of the data wirings of the memory during one clock period and the data exchange can be performed at a speed more than the frequency of the global clock, by the N times as much as the global clock. Moreover, since the fast source synchronous signal is only used in exchanging the data signal, there is not only an effect on the reduction of the consumption power in comparison with the synchronous memory which operates at a high speed in the single circuit of the overall memory and performs the data exchange of the frequency. But also, regardless of which one of the memory and the memory controller serves as a receiver of the data by synchronizing the data exchange with the source synchronous signal, inasmuch as the phase difference between the synchronous signals of each data is constant at each receiver, it has a positive influence on further increasing the maximum operating frequency.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment discloses as the best mode contemplated for carrying out the present invention, but that the present invention includes all embodiments falling within the scope of the appended claims.

What is claimed is:

1. A semiconductor memory device which includes a plurality of bit lines, a plurality of word lines crossed with said plurality of bit lines, and a memory cell array including a plurality of memory cells positioned at cross points where said bit lines are crossed with said word lines, comprising:

an address port for receiving inputs of a row address supplied while a row address enable signal is in a first state and a column address enable signal is in a second state, and a column address supplied while said column address enable signal is in the first state and said row address enable signal is in the second state;

a row decoder for receiving the input of said row address from the address port and enabling a word line corresponding to the received row address;

a plurality of sense amplifiers for amplifying signals of said bit lines enabled by said memory cells connected to said enabled word line;

a column decoder for receiving the input of said column address from the address port and coupling a selected bit line to a common data line; and a source synchronous interface means for interfacing said data common line with the exterior and exchanging data between the exterior of the device and said memory cell array.

2. A semiconductor memory device which includes a plurality of bit lines, a plurality of word lines crossed with said plurality of bit lines, and a memory cell array including a plurality of memory cells positioned at cross points where said bit lines are crossed with said word lines, comprising:

an address port for receiving inputs of a row address supplied while a row address enable signal is in a first state and a column address enable signal is in a second state, and a column address supplied while said column address enable signal is in the first state and said row address enable signal is in the second state;

a row decoder for receiving the input of said row address from the address port and enabling a word line corresponding to the received row address;

a plurality of sense amplifiers for amplifying signals of said bit lines enabled by said memory cells connected to said enabled word line;

a column decoder for receiving the input of said column address from the address port and coupling a selected bit line to a common data line; and a source synchronous interface means for interfacing said data common line with the exterior and exchanging data between the exterior of the device and said memory cell array;

a row address buffer for receiving said row address and storing said received row address;

a column address buffer for receiving said column address and storing said received column address; and a controller for receiving a write enable signal, an address signal, a column address strobe, a row address strobe, an external clock signal and a chip select signal, for synchronizing said row address and said column address to said external clock, and for storing said synchronized row address and said synchronized column address at said row address buffer and said column address buffer, respectively.

3. A semiconductor memory device which includes a plurality of bit lines, a plurality of word lines crossed with said plurality of bit lines, and a memory cell array including a plurality of memory cells positioned at cross points where said bit lines are crossed with said word lines, comprising:

an address port for receiving inputs of a row address supplied while a row address enable signal is in a first state and a column address enable signal is in a second state, and a column address supplied while said column address enable signal is in the first state and said row address enable signal is in the second state;

a row decoder for receiving the input of said row address from the address port and enabling a word line corresponding to the received row address;

a plurality of sense amplifiers for amplifying signals of said bit lines enabled by said memory cells connected to said enabled word line;

a column decoder for receiving the input of said column address from the address port and coupling a selected bit line to a common data line; and a source synchronous interface means for interfacing said data common line with the exterior and exchanging data between the exterior of the device and said memory cell array; wherein said source synchronous interface means is comprised of:

a data terminal, and an I/O clock terminal for a receiving source generated synchronous clock signal, and a data output synchronous signal generator, said data terminal and I/O clock terminal arranged for transferring data between the memory device and the exterior;

a data-in buffer coupled to the data terminal for receiving sequential data synchronized to said source generated synchronous clock signal, the source generated synchronous signal being provided from the exterior through said I/O clock terminal, and for storing said received sequential data; and a data-out buffer coupled to the data terminal for simultaneously transferring a plurality of output data of said memory cell array in parallel, said transfer being synchronized to a synchronous output signal provided by the data output synchronous signal generator, and for transmitting the output synchronous signal through said data terminal to the exterior.

4. The device as defined in claim 3, wherein said data-out buffer is programmable for selecting a number of bits of output data for said simultaneous transfer.

5. The device as defined in claim 3, wherein said data output synchronous signal generator gates a sequential clock from a clock source equal to the number of said output data.

6. The device as defined in claim 3, wherein said clock source has a frequency greater than that of the internal system clock.

7. The device as defined in claim 3, wherein said clock source is comprised of a ring oscillator.

8. The device as defined in claim 7, wherein said ring oscillator is capable of programming the frequency.

9. A semiconductor memory device which includes a plurality of bit lines, a plurality of word lines crossed with said plurality of bit lines, and a memory cell array including a plurality of memory cells positioned at cross points where said bit lines are crossed with said word lines, comprising:

an address port for receiving inputs of a row address supplied while a row address enable signal is in a first state and a column address enable signal is in a second state, and a column address supplied while said column address enable signal is in the first state and said row address enable signal is in the second state;

a row decoder for receiving the input of said row address from the address port and enabling a word line corresponding to the received row address;

a plurality of sense amplifiers for amplifying signals of said bit lines enabled by said memory cells connected to said enabled word line;

a column decoder for receiving the input of said column address from the address port and coupling a selected bit line to a common data line; and a source synchronous interface means for interfacing said data common line with the exterior and exchanging data between the exterior of the device and said memory cell array; wherein said source synchronous interface is comprised of:

a terminal for data, a terminal for a source generation synchronous signal, and a data output synchronous signal generator, said terminals being for data exchange;

a data-in buffer for receiving more than two sequential data inputted from the exterior transmitted through said terminal for data, at dual edges where said source generation synchronous signal is sequentially transmitted from the exterior through said terminal for said source generation synchronous signal, and storing said received data; and a data-out buffer for simultaneously, transmitting said more than two even sequential output data of said memory cell array, from said dual edges where said data generation synchronous signal is sequentially transmitted from said data output synchronous signal generator, through said terminal for data to the exterior and for transmitting a data output synchronous signal through said terminal for said source generation synchronous signal to the exterior.

10. The device as defined in claim 9, wherein said data-out buffer is capable of programming the number of said sequential data.

11. The device as defined in claim 9, wherein said data output synchronous signal generator gates a sequential clock from a clock source as much as the number of said sequential output data.

12. The device as defined in claim 9, wherein said clock source inputs said external clock.

13. The device as defined in claim 9, wherein said clock source increases the frequency of said inputted external clock.

14. The device as defined in claim 9, wherein said clock source is comprised of a ring oscillator.

15. The device as defined in claim 9, wherein said ring oscillator is capable of programming the frequency.

16. A method of writing data into a memory array from an external data terminal comprising the steps of:

providing an input buffer;

receiving an external I/O clock signal;

storing a series of input data bits from the data terminal into the input buffer, said storing step including clocking the data bits into the input buffer responsive to the received external I/O clock signal so that said storing step is synchronized to the external I/O clock signal; and transferring a plurality at one time of said stored data bits in parallel from the input buffer into the memory array.

17. A method of writing data into a memory array from an external data terminal comprising the steps of:

providing an input buffer;

receiving an external I/O clock signal;

storing a series of input data bits from the data terminal into the input buffer, said storing step including clocking the data bits into the input buffer responsive to the received external I/O clock signal so that said storing step is synchronized to the external I/O clock signal; and transferring a plurality at one time of said stored data bits in parallel from the input buffer into the memory array;

and further comprising partitioning the input buffer into first and second input buffers, both of the first and second input buffers being coupled to the data terminal to receive the input data bits, and coupled to the memory array; and wherein said step of storing a series of input data bits from the data terminal into the input buffer includes:

sequentially storing a first series of input data bits into the first input buffer;

transferring all of the first series of stored data bits in parallel from the first input buffer into the memory array;

sequentially storing a second series of input data bits into the second input buffer;

transferring all of the second series of stored data bits in parallel from the second input buffer into the memory array; and repeating said sequentially storing and transferring data steps, alternating between the first and second input buffers, thereby interleaving the input data in the memory array and providing improved setup and hold time of the said steps of transferring the input data into the memory array.

* * * * *